(12) United States Patent
Samizo et al.

(10) Patent No.: US 10,938,306 B2
(45) Date of Patent: Mar. 2, 2021

(54) LASER DRIVING POWER SOURCE

(71) Applicant: Panasonic Intellectual Property Management Co., Ltd., Osaka (JP)

(72) Inventors: Masashi Samizo, Hyogo (JP); Naoki Kobayashi, Hyogo (JP); Ryunosuke Shibagaki, Osaka (JP); Hideki Ihara, Hyogo (JP); Toshinori Hongu, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/497,454

(22) PCT Filed: Mar. 5, 2018

(86) PCT No.: PCT/JP2018/008227
§ 371 (c)(1),
(2) Date: Sep. 25, 2019

(87) PCT Pub. No.: WO2018/186082
PCT Pub. Date: Oct. 11, 2018

(65) Prior Publication Data
US 2020/0287460 A1 Sep. 10, 2020

(30) Foreign Application Priority Data
Apr. 5, 2017 (JP) ................... 2017-074961

(51) Int. Cl.
*H02M 3/157* (2006.01)
*H05B 45/3725* (2020.01)
(Continued)

(52) U.S. Cl.
CPC ............. *H02M 3/157* (2013.01); *B23K 9/073* (2013.01); *H01S 3/102* (2013.01); *H02M 7/48* (2013.01); *H05B 45/3725* (2020.01)

(58) Field of Classification Search
None
See application file for complete search history.

(56) References Cited

U.S. PATENT DOCUMENTS

| 2008/0084721 | A1 | 4/2008 | Miramonti et al. |
| 2017/0070024 | A1 | 3/2017 | Kawasuji et al. |

(Continued)

FOREIGN PATENT DOCUMENTS

| JP | 2-041778 | 2/1990 |
| JP | 7-255177 | 10/1995 |

(Continued)

OTHER PUBLICATIONS

The Extended European Search Report dated Feb. 27, 2020 for the related European Patent Application No. 18781415.7.

(Continued)

*Primary Examiner* — Jeffrey A Gblende
*Assistant Examiner* — Henry E Lee, III
(74) *Attorney, Agent, or Firm* — Wenderoth, Lind & Ponack, L.L.P.

(57) ABSTRACT

Response fluctuation of output current due to fluctuation of input voltage is reduced by control device (CM) including current fluctuation reduction control means (CFC) that is a regulator for regulating any of an output current command signal, a current detection value, and a control gain when the input voltage fluctuates.

2 Claims, 5 Drawing Sheets

(51) Int. Cl.
    *B23K 9/073*     (2006.01)
    *H01S 3/102*     (2006.01)
    *H02M 7/48*     (2007.01)

(56) References Cited

U.S. PATENT DOCUMENTS

2017/0163006 A1*   6/2017   Honda .................. H05B 45/37
2018/0123397 A1*   5/2018   Tsukiyama ............. H02J 50/12

FOREIGN PATENT DOCUMENTS

| | | |
|---|---|---|
| JP | 2002-192363 | 7/2002 |
| JP | 2004-047538 | 2/2004 |
| JP | 2016-010258 | 1/2016 |
| JP | 2017-046403 | 3/2017 |
| WO | 2016/002648 | 1/2016 |

OTHER PUBLICATIONS

International Search Report of PCT application No. PCT/JP2018/008227 dated Apr. 10, 2018.

* cited by examiner

LASER DRIVING POWER SOURCE

TECHNICAL FIELD

The present disclosure relates to a laser driving power source for supplying current to a laser oscillator of a laser processing machine such as a laser welding or cutting machine.

BACKGROUND ART

Recently, a demand for higher speed and higher quality has been increased in metal processing field. To satisfy the demand, a processing machine such as a fiber laser or a direct diode laser has been introduced, the processing machine mounting thereon a semiconductor laser oscillator.

The semiconductor laser oscillator outputs laser light by being supplied with current, so that the semiconductor laser oscillator is affected by output current properties of a driving power source. High performance and high quality have been required also of the driving power source on the way of introducing a semiconductor laser processing machine.

Output current response of the driving power source is affected by fluctuation of input voltage, and the response becomes slow when the input voltage becomes low, and the response becomes fast when the input voltage becomes high. The fluctuation of the response is largely affected specifically when steep change such as pulse current output is required. In a laser processing machine, fluctuation of output current results in fluctuation of heat amount applied to a workpiece material, affecting heat input to the workpiece material. Accordingly, there is a problem in that machining accuracy of laser cutting and welding is deteriorated.

In a conventional technique, a configuration has been disclosed including a power converter that controls voltage input to an inverter unit to be constant voltage in a former stage of the inverter unit of the driving power source. Adding such a power converter makes it possible to keep voltage input to the inverter unit constant even when input voltage fluctuates (e.g., PTL 1).

CITATION LIST

Patent Literature

PTL 1: Unexamined Japanese Patent Publication No. 1102-41778

SUMMARY OF THE INVENTION

However, as in the conventional technique, there are problems in that cost is increased, loss is increased, equipment is upsized in the configuration in which a power converter for controlling voltage to be constant is provided to eliminate influence due to fluctuation of input voltage to a later stage.

An aspect of the present disclosure provides a laser driving power source that eliminates fluctuation of output current due to fluctuation of input voltage without requiring an additional power converter.

A laser driving power source according to an aspect of the present disclosure is a laser driving power source for supplying current to output laser light to a laser oscillator to drive the laser oscillator, the laser driving power source including: a power converter including a primary rectifier circuit that rectifies input voltage of AC power and converts the input voltage into DC voltage, an inverter unit that converts the DC voltage into AC voltage, a power conversion transformer that converts power of the AC voltage to generate secondary current, a secondary rectifier circuit that rectifies the secondary current and converts the secondary current into output current to be supplied to the laser oscillator, a drive circuit that outputs a drive signal for driving a semiconductor switch forming the inverter unit, and output current detection means that detects the output current and outputs a current detection value; and a control device including current fluctuation reduction control means that regulates at least any one signal among the current detection value, an output current command signal, and a control gain used to calculate operation amount controlled to a deviation between the current detection value and the output current command signal to reduce fluctuation of response of the output current due to fluctuation of the input voltage to generate a regulator signal, and outputs the regulator signal when change of the output current command signal that is a control target of the output current is fast with respect to response to the output current, and output current control means that outputs an output current control signal to be input to the drive circuit to control the output current using the regulator signal and a signal that has not been regulated by the current fluctuation reduction control means among the current detection value, the output current command signal, and the control gain.

The laser driving power source according to an aspect of the present disclosure enables to eliminate fluctuation of output current due to fluctuation of input voltage without requiring an additional power converter.

DESCRIPTION OF EMBODIMENTS

First Exemplary Embodiment

Figure 1:
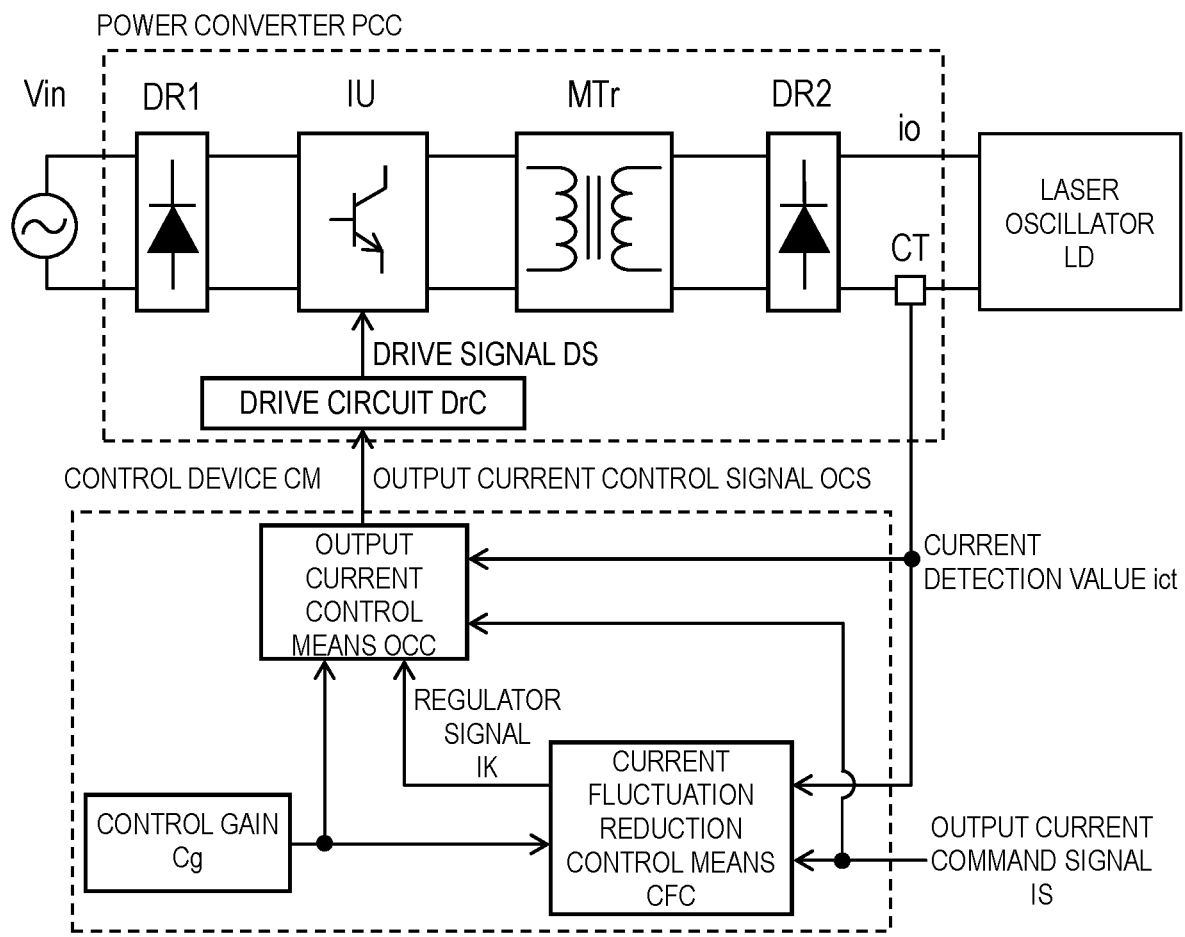
FIG. 1 is a configuration diagram of a laser driving power source according to an aspect of the present disclosure.

The exemplary embodiment will be described with reference to FIGS. 1 to 4. FIG. 1 illustrates a configuration of a driving power source for laser of a laser oscillator according to an aspect of the present disclosure. The driving power source includes power converter PCC and control device CM, and is a laser driving power source that converts electric power to obtain current and voltage suitable for laser oscillator LD. Power converter PCC includes primary rectifier circuit DR1, inverter unit IU, power conversion transformer MTr, and secondary rectifier circuit DR2. Primary rectifier circuit DR1 rectifies input voltage Vin of AC power and converts input voltage Vin into DC voltage. Inverter unit IU converts the DC voltage into AC voltage. Power conversion transformer MTr converts power of the AC voltage to generate secondary current. Secondary rectifier circuit DR2 rectifies the secondary current and converts the secondary current into output current supplied to laser oscillator LD.

Power converter PCC further includes drive circuit DrC and output current detection circuit CT. Drive circuit DrC outputs drive signal DS for driving a semiconductor switch forming inverter unit IU. Output current detection circuit CT detects output current io and outputs output current detection value ict. Control device CM includes current fluctuation reduction control means CFC, output current control means OCC, and control gain Cg. Current fluctuation reduction control means CFC outputs regulator signal IK for reducing fluctuation of response of output current io due to fluctuation of input voltage. Output current control means OCC controls inverter unit IU to make output current io equal to output current command signal IS that is a control target. Control gain Cg is used to calculate operation amount controlled to a deviation between output current detection value ict indicating output current io and output current command signal IS indicating the control target.

Figure 2:
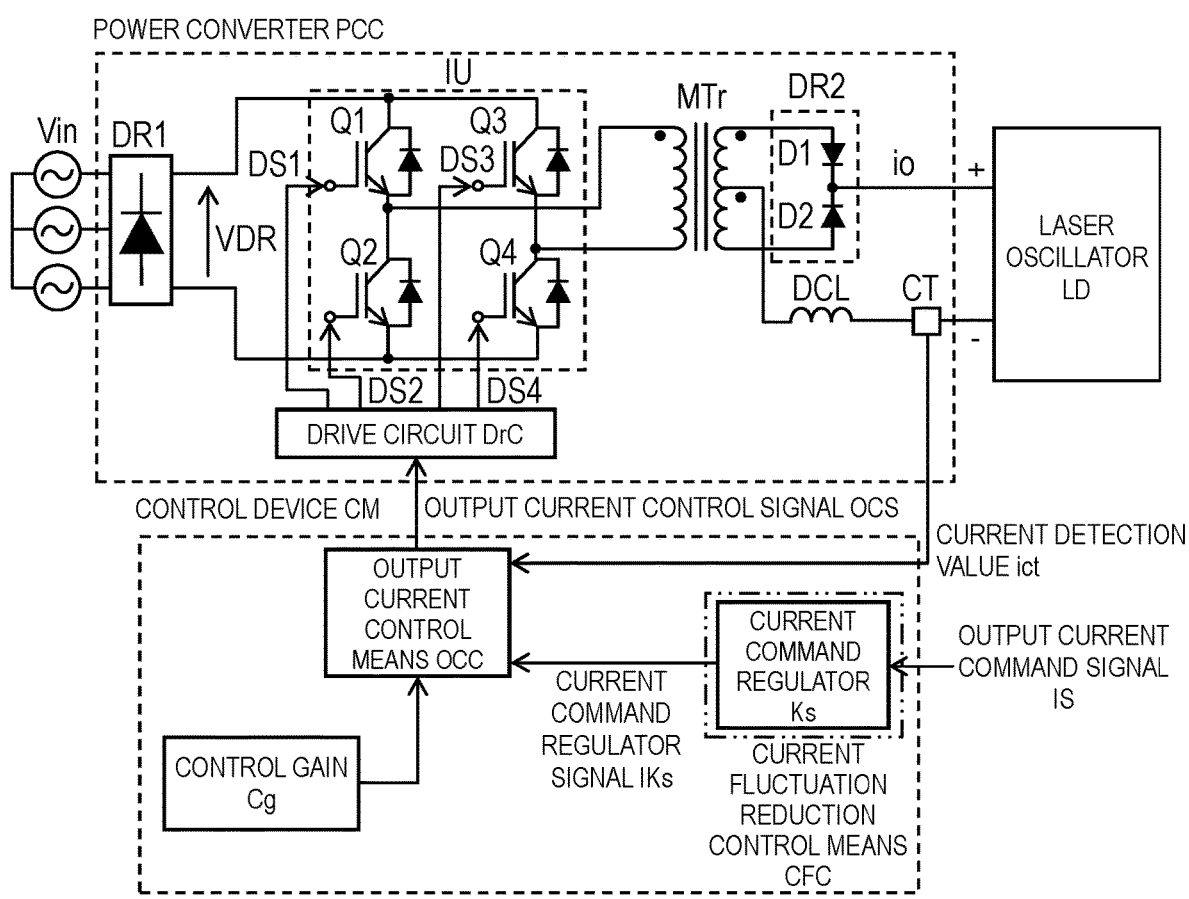
FIG. 2 is an electrical connection diagram of a laser driving power source according to a first exemplary embodiment of the present disclosure.

FIG. 2 illustrates a configuration of a laser driving power source of a laser oscillator according to a first exemplary embodiment of the present disclosure.

Primary rectifier circuit DR1 rectifies input voltage Vin that is three-phase AC and converts input voltage Vin into rectified voltage VDR that is DC voltage. Inverter unit IU includes a first circuit part having first switching element Q1 and second switching element Q2, and a second circuit part having third switching element Q3 and fourth switching element Q4. The first circuit part is connected to the second circuit part in parallel. First switching element Q1 is connected to second switching element Q2 in series. Third switching element Q3 is connected to fourth switching element Q4 in series. Inverter unit IU converts rectified voltage VDR into AC voltage by control of each switching element.

Note that the switching elements may be a semiconductor switch such as an insulated gate bipolar transistor (IGBT) or a metal oxide semiconductor field effect transistor (MOSFET).

Power conversion transformer MTr includes a primary side coil and a secondary side coil. The primary side coil is connected between an emitter of first switching element Q1 and a collector of fourth switching element Q4. Power conversion transformer MTr converts AC voltage input to the primary side coil and outputs voltage and current suitable for laser oscillator LD from the secondary side coil. The secondary side coil of power conversion transformer MTr includes a middle tap.

Secondary rectifier circuit DR2 has a configuration in which a cathode of first diode D1 is connected to a cathode of second diode D2 are connected. AC current on a secondary side of power conversion transformer MTr is converted into output current io that is DC current. An anode of first diode D1 is connected to one end of the secondary side coil of power conversion transformer MTr, and an anode of second diode D2 is connected to the other end of the secondary side coil of power conversion transformer MTr. Each cathode of first diode D1 and second diode D2 is connected to a plus terminal of laser oscillator Ld.

The middle tap of power conversion transformer MTr and one end of DC reactor DCL are connected, and the other end of DC reactor DCL and a minus terminal of laser oscillator LD are connected. DC reactor DCL smooths output current io. This makes power converter PCC supply output current io suitable for laser oscillator LD to laser oscillator LD. Output current detection circuit CT is installed on a wiring connected to laser oscillator LD, and outputs output current detection value ict.

Next, control device CM that controls power converter PCC will be described. Control device CM includes output current control means OCC, control gain Cg, and current command regulator Ks that is current fluctuation reduction control means CFC for reducing fluctuation of response of output current io.

Output current command signal IS is input from outside or generated inside of control device CM, a set value signal according to output current io regulated by a worker, and a signal indicating a control target of output current io.

Output current command signal IS is input to current command regulator Ks. Current command regulator Ks is formed of a primary delay element (e.g., primary low-pass filter or the like) that generates a primary delay. A filter design method of current command regulator Ks will be described with reference to FIGS. 2, 3, and 4.

Figure 3:
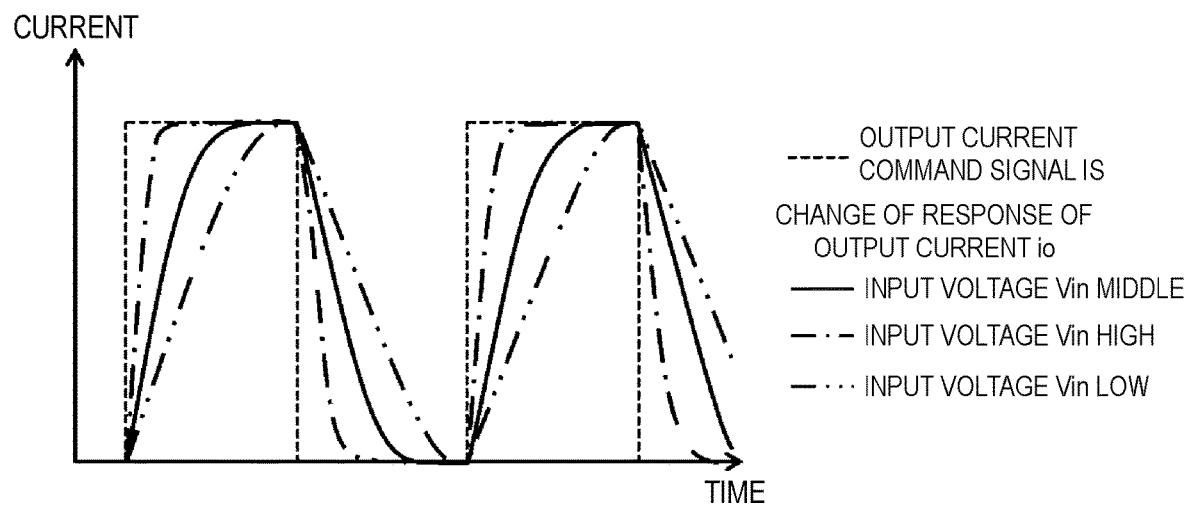
FIG. 3 is a diagram illustrating an example of change of response of output current due to fluctuation of input voltage with respect to a pulse current command signal in a driving power source to which no current command regulator is added.

FIG. 3 illustrates fluctuation of response of output current io in a case where output current command signal IS is input. In this manner, when a pulse signal is input to output current command signal IS, response of output current io becomes fast when input voltage Vin becomes high as shown by a one-dot chain line, and response of the output current becomes slow when input voltage Vin becomes low as shown by a two-dot chain line. Accordingly, a waveform of output current io changes due to fluctuation of input voltage Vin.

Figure 4:
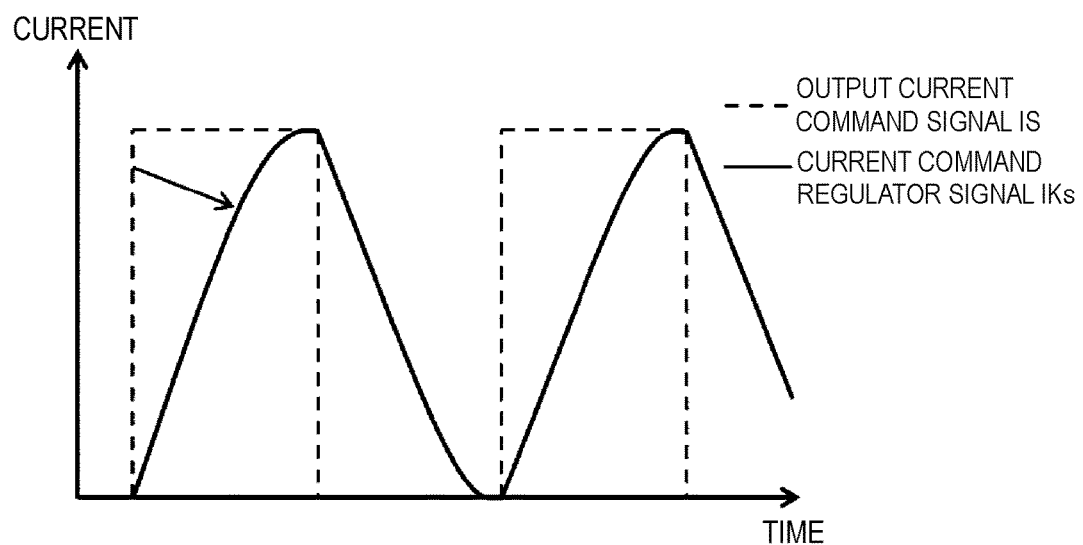
FIG. 4 is a diagram illustrating an example of an output current command signal and a current command regulator signal.

When change of output current command signal IS is equivalent to or less than or equal to a latest response of the laser driving power source, the waveform of output current io is not affected by fluctuation of input voltage Vin. In this case, the waveform of output current io can be made equivalent to a waveform of output current command signal IS. FIG. 4 illustrates generation of current command regulator signal IKs in a case where output current command signal IS is input. In this manner, current command regulator Ks generates current command regulator signal IKs shown by a solid line to which a delay is applied to output current command signal IS shown by a broken line as described above.

For example, when response of output current io becomes the slowest is when input voltage Vin is lowest voltage Vm within a range of input voltage Vin ensured by the laser driving power source. Accordingly, response of output current io is measured in a case where lowest voltage Vm is input as input voltage Vin and a pulse signal is input as output current command signal IS to make the laser driving power source operate. Filter properties of a primary delay filter in current command regulator Ks are designed such that change of the pulse signal becomes equivalent to or less than or equal to response measured.

Output current control means OCC generates output current control signal OCS using output current detection value ict, current command regulator signal IKs, and control gain Cg. Control gain Cg is used to calculate operation amount controlled to a deviation between output current detection value ict and current command regulator signal IKs. Output current control signal OCS is a signal to control inverter unit IU such that output current io becomes equal to current command regulator signal IKs.

Drive circuit DrC generates first drive signal DS1, second drive signal DS2, third drive signal DS3, and fourth drive signal DS4 based on output current control signal OCS. First drive signal DS1 drives first switching element Q1. Second drive signal DS2 drives second switching element Q2. Third drive signal DS3 drives third switching element Q3. Fourth drive signal DS4 drives fourth switching element Q4. This controls output current io.

Regulating output current command signal IS by the above-mentioned configuration makes it possible to supply output current io reduced in fluctuation of response due to fluctuation of input voltage Vin.

Second Exemplary Embodiment

Figure 5:
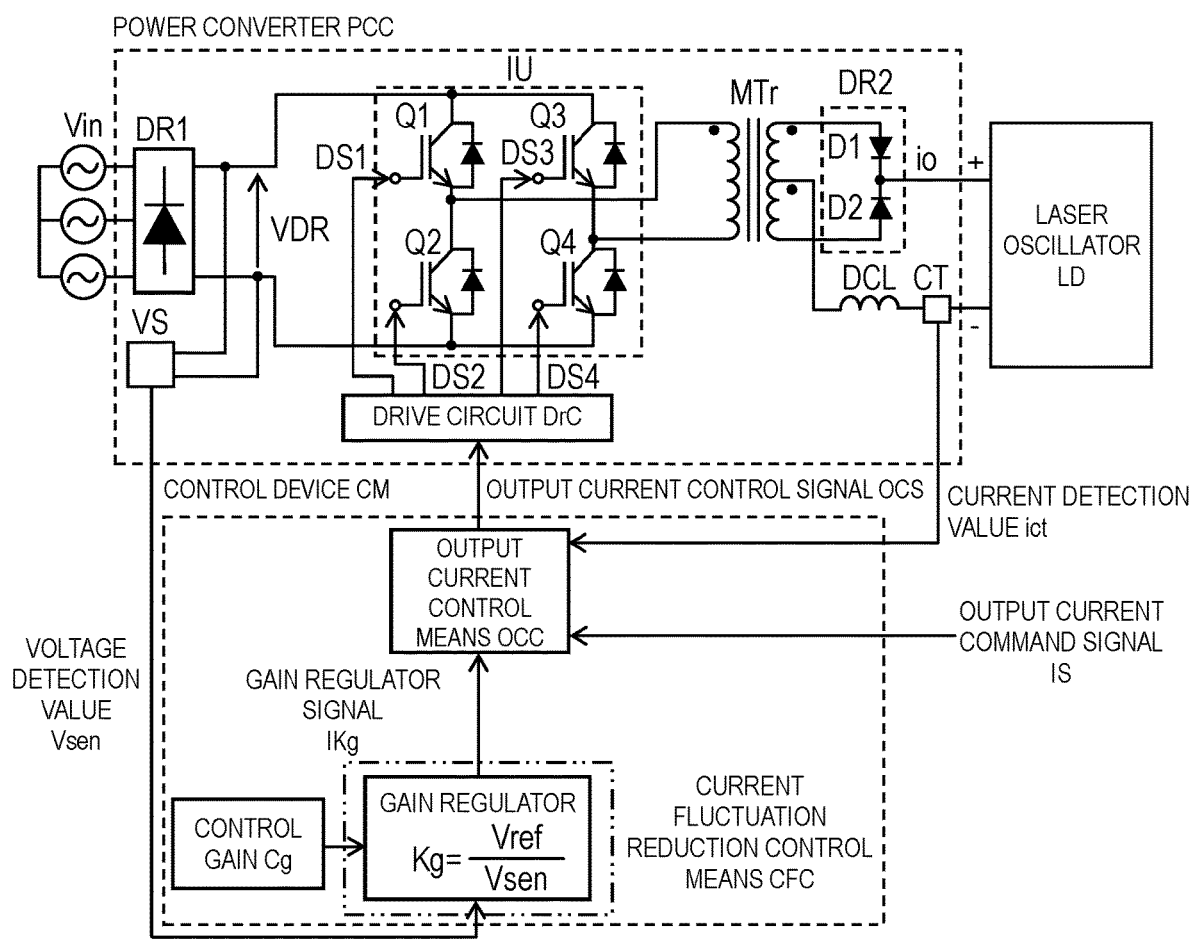
FIG. 5 is an electrical connection diagram of a laser driving power source according to a second exemplary embodiment of the present disclosure.
Figure 6:
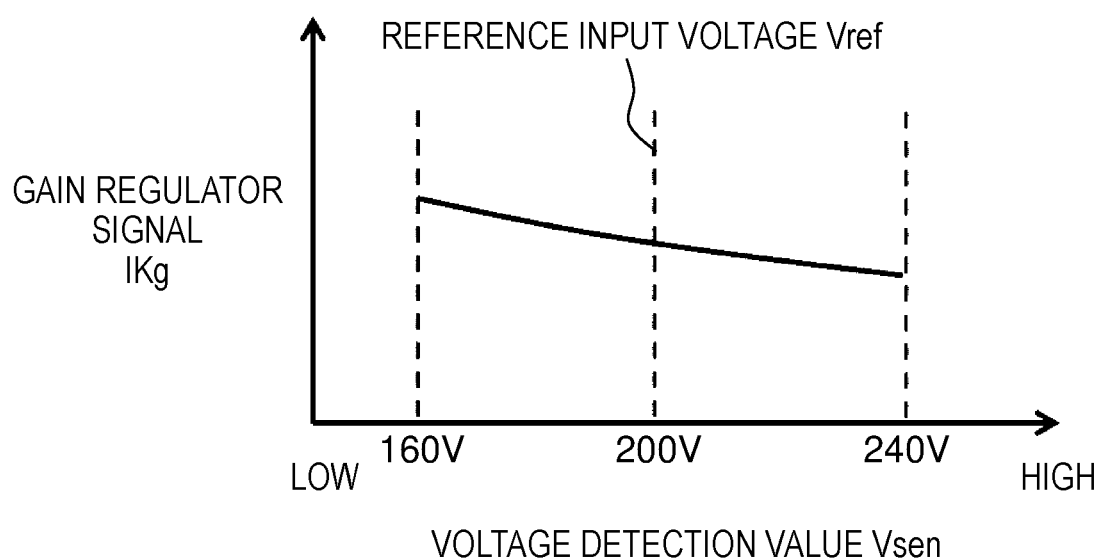
FIG. 6 is a diagram illustrating an example of a relation between a voltage detection value and a gain regulator signal according to the second exemplary embodiment of the present disclosure.

Next, a second exemplary embodiment will be described with reference to FIGS. 5 and 6. FIG. 5 illustrates a configuration of a laser driving power source of a laser oscillator according to the second exemplary embodiment of the present disclosure. In the first exemplary embodiment, current command regulator Ks is employed as current fluctuation reduction control means CFC that reduces response fluctuation of output current io included in control device CM. In contrast, in the second exemplary embodiment, gain regulator Kg is employed as current fluctuation reduction control means CFC. In the second exemplary embodiment, power converter PCC further includes voltage detection circuit VS that detects rectified voltage VDR that is a voltage obtained by rectifying input voltage Vin by primary rectifier circuit DR1. Main circuit operation is the same as that in the first exemplary embodiment, so that only a control method of control device CM different from that in the first exemplary embodiment will be described.

Voltage detection circuit VS is connected to primary rectifier circuit DR1 in parallel to detect rectified voltage VDR between output terminals of primary rectifier circuit DR1. Voltage detection value Vsen obtained by voltage detection circuit VS and control gain Cg are input to gain regulator Kg. Gain regulator Kg multiplies control gain Cg by a coefficient inversely proportional to voltage detection value Vsen. The coefficient of gain regulator Kg is a value obtained by dividing reference input voltage Vref by voltage detection value Vsen. Gain regulator Kg multiplies control gain Cg by the coefficient of gain regulator Kg to generate gain regulator signal IKg. FIG. 6 illustrates a relation between voltage detection value Vsen and gain regulator signal IKg.

In this manner, voltage detection value Vsen and gain regulator signal IKg are in an inverse proportion relation. Reference input voltage Vref is a value equivalent to voltage detection value Vsen in a case of a medium value of fluctuation of input voltage Vin. For example, reference input voltage Vref matches voltage detection value Vsen at a medium value of 200 V in a case where a secured range of input voltage Vin is from 160 V to 240 V.

Output current control means OCC generates output current control signal OCS using gain regulator signal IKg, output current detection value ict, and output current command signal IS. Output current control signal OCS is a signal to control inverter unit IU to make output current io equal to output current command signal IS. Specifically, output current control signal OCS is a signal to control conductivity Duty that is a rate of supplying voltage or current to power conversion transformer MTr by inverter unit IU.

Drive circuit DrC generates first drive signal DS1, second drive signal DS2, third drive signal DS3, and fourth drive signal DS4 based on output current control signal OCS. First drive signal DS1 drives first switching element Q1. Second drive signal DS2 drives second switching element Q2. Third drive signal DS3 drives third switching element Q3. Fourth drive signal DS4 drives fourth switching element Q4. This controls output current io.

For example, when input voltage Vin rises and voltage detection value Vsen becomes higher than reference input voltage Vref to make response of output current io fast, the coefficient of gain regulator Kg becomes smaller than 1. Then, gain regulator signal IKg becomes smaller than control gain Cg, regulating conductivity Duty of inverter unit IU to be low. This makes response of output current io slow.

In contrast, when input voltage Vin drops and voltage detection value Vsen becomes lower than reference input voltage Vref to make response of the output current io slow, the coefficient of gain regulator Kg becomes larger than 1. Then, gain regulator signal IKg becomes larger than control gain Cg, regulating conductivity Duty of inverter unit IU to be high. This makes response of output current io fast.

The above-mentioned configuration makes it possible to control response of output current io depending on fluctuation of input voltage Vin by regulating control gain Cg. This makes it possible to supply output current io reduced in fluctuation of response due to fluctuation of input voltage Vin.

As described above, the laser driving power source according to the aspect of the present disclosure is a laser driving power source that supplies current to output laser light to laser oscillator LD to drive laser oscillator LD. The laser driving power source includes power converter PCC and control device CM. Power converter PCC includes primary rectifier circuit DR1, inverter unit IU, power conversion transformer MTr, and secondary rectifier circuit DR2. Primary rectifier circuit DR1 rectifies input voltage Vin of AC power and converts input voltage Vin into DC voltage. Inverter unit IU converts the DC voltage into AC voltage. Power conversion transformer MTr converts power of the AC voltage to generate secondary current. Secondary rectifier circuit DR2 rectifies the secondary current and converts the secondary current into output current supplied to laser oscillator LD.

Power converter PCC further includes drive circuit DrC and output current detection circuit CT. Drive circuit DrC outputs the drive signal for driving a semiconductor switch forming inverter unit IU. Output current detection circuit CT detects output current io and outputs output current detection value ict.

Control device CM includes current fluctuation reduction control means CFC that regulates at least any one signal among output current detection value ict, output current command signal IS, and control gain Cg to reduce fluctuation of response of output current io due to fluctuation of input voltage Vin to generate regulator signal IK, and outputs the regulator signal when change of output current command signal IS that is a control target of output current io is fast with respect to response of output current io.

Control device CM also includes output current control means OCC that outputs output current control signal OCS using regulator signal IK and every signal that has not been regulated by current fluctuation reduction control means CFC among output current detection value ict, output current command signal IS, and control gain Cg.

In addition to the above-mentioned method, current fluctuation reduction control means CFC may regulate output current command signal IS as described in detail in the first exemplary embodiment as one method. Specifically, current fluctuation reduction control means CFC may include current command regulator Ks that generates current command regulator signal IKs by regulating output current command signal IS. Current command regulator Ks includes the primary delay element that generates a primary delay to make change of output current command signal IS slow in response to a latest response of output current io in a voltage range ensured to input voltage Vin. Output current command signal IS is input to current command regulator Ks. The laser driving power source controls output current io without delay or with a slight delay with respect to current command regulator signal IKs regardless of fluctuation of input voltage Vin by delaying change of output current command signal IS.

Note that control of output current io with a slight delay with respect to output current command signal IS means a slight delay that is a degree allowable in variation of machining accuracy by a laser processing machine.

In addition to the above-mentioned method, current fluctuation reduction control means CFC may regulate control gain Cg as described in detail in the second exemplary embodiment as one method. Specifically, power converter PCC includes voltage detection circuit VS that detects input voltage Vin or rectified voltage VDR. Current fluctuation reduction control means CFC includes gain regulator Kg for regulating control gain Cg depending on voltage detection value Vsen by multiplying control gain Cg by a coefficient inversely proportional to voltage detection value Vsen.

In this manner, the laser driving power source of the present disclosure reduces response fluctuation of output current io by controlling conductivity Duty of inverter unit IU depending on voltage detection value Vsen to control response of output current io.

As described in the first exemplary embodiment and the second exemplary embodiment, the laser driving power source according to the present disclosure reduces fluctuation of response of output current io due to fluctuation of input voltage Vin by operation of control device CM including current fluctuation reduction control means CFC. Specifically, control device CM has a parameter for regulating output current command signal IS or control gain Cg related to control. Current fluctuation reduction control means CFC operates as a regulator for regulating any of output current command signal IS, output current detection value ict, and control gain Cg.

Such a laser driving power source enables to eliminate fluctuation of the output current due to fluctuation of the input voltage to reduce output fluctuation of laser light. This enables to improve machining accuracy. Furthermore, the above-mentioned laser driving power source needs no additional power converter or no additional element. This enables to lower cost and increase efficiency.

Control device CM of the second exemplary embodiment makes response of output current io close to response at the time of reference input voltage Vref. This makes it possible to make response of output current io fast to reduce response fluctuation as compared to the first exemplary embodiment. However, when conductivity Duty after regulation exceeds an upper limit of conductivity Duty, reduction effect of response fluctuation becomes small. In the first exemplary embodiment, influence of other parameters is small, making it possible to obtain a constant reduction effect.

In the first exemplary embodiment, output current command signal IS is regulated to reduce fluctuation of response of the output current due to fluctuation of the input voltage. In the second exemplary embodiment, control gain Cg is regulated instead of regulating output current command signal IS. The present disclosure is not limited thereto, and output current detection value ict may be regulated. Regulating output current detection value ict also enables to reduce fluctuation of response of the output current due to fluctuation of the input voltage.

In both the first exemplary embodiment and the second exemplary embodiment, a signal to be regulated is one. The signal is output current command signal IS in the first exemplary embodiment, and control gain Cg in the second exemplary embodiment. The present disclosure is not limited thereto, and a number of signals to be regulated may be two or three. For example, two signals that are output current command signal IS and control gain Cg may be regulated. Alternatively, for example, three signals that are output current detection value ict, output current command signal IS, and control gain Cg may be regulated.

INDUSTRIAL APPLICABILITY

The present disclosure is industrially useful as a control method capable of reducing variation of machining accuracy of a laser processing machine mounting thereon a laser oscillator by reducing output current fluctuation of a laser driving power source of the laser oscillator due to fluctuation of input voltage.

REFERENCE MARKS IN THE DRAWINGS

Vin: input voltage
PCC: power converter
DR1: primary rectifier circuit
IU: inverter unit
VDR: rectified voltage
Q1: first switching element
Q2: second switching element
Q3: third switching element
Q4: fourth switching element
MTr: power conversion transformer
DR2: secondary rectifier circuit
D1: first diode
D2: second diode
DCL: DC reactor
io: output current
LD: laser oscillator
CT: output current detection circuit
ict: output current detection value
CM: control device
CFC: current fluctuation reduction control means
IK: regulator signal
OCC: output current control means
Cg: control gain
Ks: current command regulator
IS: output current command signal
IKs: current command regulator signal
Vm: lowest voltage
OCS: output current control signal
DrC: drive circuit
DS1: first drive signal
DS2: second drive signal
DS3: third drive signal
DS4: fourth drive signal
VS: voltage detection circuit
Vsen: voltage detection value
Kg: gain regulator
Vref: reference input voltage IKg: gain regulator signal
Duty: conductivity

The invention claimed is:

1. A laser driving power source for supplying current to output laser light to a laser oscillator to drive the laser oscillator, the laser driving power source comprising:
a power converter including
a primary rectifier circuit that rectifies input voltage of AC power and converts the input voltage into DC voltage,
an inverter unit that converts the DC voltage into AC voltage, wherein the inverter unit includes a semiconductor switch,
a power conversion transformer that converts power of the AC voltage to generate secondary current,
a secondary rectifier circuit that rectifies the secondary current and converts the secondary current into output current to be supplied to the laser oscillator,
a drive circuit that outputs a drive signal for driving the semiconductor switch of the inverter unit, and
output current detection means that detects the output current and outputs a current detection value; and
a control device including
current fluctuation reduction control means that regulates at least any one signal among the current detection value, an output current command signal, and a control gain used to calculate an operation amount controlled to a deviation between the current detection value and the output current command signal to reduce fluctuation of response of the output current due to fluctuation of the input voltage to generate a regulator signal, and outputs the regulator signal when change of the output current command signal that is a control target of the output current is fast with respect to response to the output current, and
output current control means that outputs an output current control signal to be input to the drive circuit to control the output current using the regulator signal and a signal that has not been regulated by the current fluctuation reduction control means among the current detection value, the output current command signal, and the control gain,
wherein
the current fluctuation reduction control means regulates the output current command signal,
the power converter has a voltage range ensured to the input voltage,
the current fluctuation reduction control means in the control device includes a current command regulator that regulates the output current command signal to make change of the output current command signal slow in response to a latest response of the output current in the ensured voltage range,
the current command regulator includes a primary delay element that generates a primary delay to the output current command signal to generate the regulator signal, and
control of the output current is made possible without delay or with a slight delay with respect to the regulator signal regardless of fluctuation of the input voltage by delaying change of the output current command signal.

2. A laser driving power source for supplying current to output laser light to a laser oscillator to drive the laser oscillator, the laser driving power source comprising:
a power converter including
a primary rectifier circuit that rectifies input voltage of AC power and converts the input voltage into DC voltage,
an inverter unit that converts the DC voltage into AC voltage, wherein the inverter unit includes a semiconductor switch,
a power conversion transformer that converts power of the AC voltage to generate secondary current,
a secondary rectifier circuit that rectifies the secondary current and converts the secondary current into output current to be supplied to the laser oscillator,
a drive circuit that outputs a drive signal for driving the semiconductor switch of the inverter unit, and
output current detection means that detects the output current and outputs a current detection value; and
a control device including
current fluctuation reduction control means that regulates at least any one signal among the current detection value, an output current command signal, and a control gain used to calculate an operation amount controlled to a deviation between the current detection value and the output current command signal to reduce fluctuation of response of the output current due to fluctuation of the input voltage to generate a regulator signal, and outputs the regulator signal when change of the output current command signal that is a control target of the output current is fast with respect to response to the output current, and
output current control means that outputs an output current control signal to be input to the drive circuit to control the output current using the regulator signal and a signal that has not been regulated by the current fluctuation reduction control means among the current detection value, the output current command signal, and the control gain,
wherein
the current fluctuation reduction control means regulates the control gain,
the power converter includes input voltage detection means that detects the input voltage or the DC voltage to output a voltage detection value,
the current fluctuation reduction control means of the control device includes a gain regulator that regulates the control gain depending on the voltage detection value by multiplying the control gain by a coefficient inversely proportional to the voltage detection value, and
response fluctuation of the output current is reduced by controlling conductivity of the inverter unit depending on the voltage detection value to control response of the output current.

* * * * *